(12) United States Patent
Lee

(10) Patent No.: US 12,219,759 B2
(45) Date of Patent: Feb. 4, 2025

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Ki Hong Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 263 days.

(21) Appl. No.: 17/215,639

(22) Filed: Mar. 29, 2021

(65) Prior Publication Data

US 2022/0102373 A1    Mar. 31, 2022

(30) Foreign Application Priority Data

Sep. 28, 2020   (KR) .................. 10-2020-0125709

(51) Int. Cl.
| | | |
|---|---|---|
| *H10B 41/27* | (2023.01) | |
| *H10B 41/10* | (2023.01) | |
| *H10B 43/10* | (2023.01) | |
| *H10B 43/27* | (2023.01) | |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 7,969,789 B2 | 6/2011 | Katsumata et al. | |
| 2017/0110473 A1* | 4/2017 | Lee ................... | H01L 21/76897 |
| 2021/0066343 A1* | 3/2021 | Choi ................... | H10B 43/10 |

FOREIGN PATENT DOCUMENTS

| | | | |
|---|---|---|---|
| CN | 102148192 A | * | 8/2011 |
| KR | 1020180033369 A | | 4/2018 |
| KR | 102059525 B1 | | 12/2019 |

OTHER PUBLICATIONS

Machine translation of CN-102148192-A, 2011.*

* cited by examiner

*Primary Examiner* — Suberr L Chi
*Assistant Examiner* — Carnell Hunter, III
(74) *Attorney, Agent, or Firm* — WILLIAM PARK & ASSOCIATES LTD.

(57) ABSTRACT

Provided herein may be a method of manufacturing a semiconductor device. The method may include forming a stacked structure including alternately stacked first material layers and second material layers; forming a first opening including a through hole passing through the stacked structure and a notch coupled to the through hole and located in at least one of the interfaces of the first material layers and second material layers; forming a sacrificial layer including a first part located in the through hole and a second part located in the notch; and oxidizing the first part of the sacrificial layer and thereby forming a first sacrificial pattern located in the through hole and a plugging pattern located in the notch.

17 Claims, 22 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2020-0125709 filed on Sep. 28, 2020, in the Korean Intellectual Property Office, the entire disclosure of which is incorporated by reference herein.

BACKGROUND

1. Technical Field

Various embodiments of the present disclosure generally relate to an electronic device, and more particularly, to a semiconductor device and a method of manufacturing the semiconductor device.

2. Related Art

The degree of integration of a semiconductor device is mainly determined depending on the area possessed by a unit memory cell. As the improvement in the degree of integration of a semiconductor device configured to form memory cells in a single layer on a substrate has recently reached a limit, a 3D semiconductor device configured to stack memory cells on a substrate is proposed. Also, in order to improve the operation reliability of such a semiconductor device, various structures and manufacturing methods are being developed.

SUMMARY

An embodiment of the present disclosure may provide for a method of manufacturing a semiconductor device. The method may include forming a stacked structure including alternately stacked first material layers and second material layers, forming a first opening including a through hole passing through the stacked structure and a notch coupled to the through hole and located in at least one of the interfaces of the first material layers and second material layers, forming a sacrificial layer including a first part located in the through hole and a second part located in the notch, and oxidizing the first part of the sacrificial layer and thereby forming a first sacrificial pattern located in the through hole and a plugging pattern located in the notch.

An embodiment of the present disclosure may provide for a method of manufacturing a semiconductor device. The method may include forming a stacked structure including alternately stacked first material layers and second material layers and at least one interface layer interposed between the first material layers and the second material layers, forming a first opening including a through hole passing through the stacked structure and at least one notch coupled to the through hole and protruding into the at least one interface layer, forming a sacrificial layer in the first opening to fill the notch, and forming a plugging pattern located in the notch by oxidizing a portion of the sacrificial layer.

An embodiment of the present disclosure may provide for a method of manufacturing a semiconductor device. The method may include forming a stacked structure, forming a first opening passing through the stacked structure and including a first region, a second region, a bowing region located between the first and second regions, and a notch coupled to the bowing region and protruding into the stacked structure, the first region having a first width, the second region having a second width less than the first width, and the bowing region having a third width greater than the first width, forming a sacrificial layer in the first opening to fill the notch, and forming a plugging pattern located in the notch by oxidizing a portion of the sacrificial layer.

An embodiment of the present disclosure may provide for a semiconductor device. The semiconductor device may include a stacked structure including alternately stacked conductive layers and insulating layers, a channel structure penetrating the stacked structure, and a plugging pattern located in at least one of the interfaces between the conductive layers and insulating layers and including a first surface facing the conductive layer and a second surface facing the insulating layer, at least one of the first and second surfaces having an inclination.

DETAILED DESCRIPTION

Figure 1A:
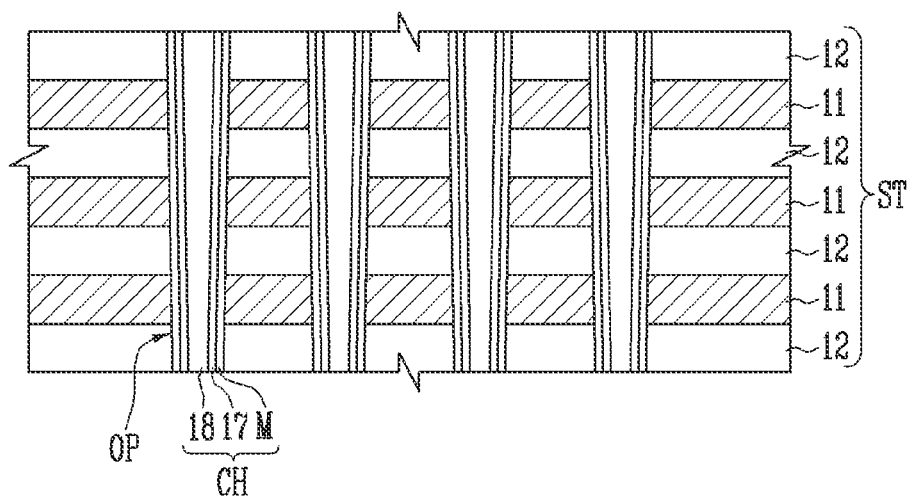
FIG. 1A and FIG. 1B are views illustrating the structure of a semiconductor device according to an embodiment of the present disclosure.

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application. Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Various embodiments of the present disclosure are directed to a semiconductor device having a stable structure and improved characteristics and a method of manufacturing the semiconductor device.

Figure 1B:
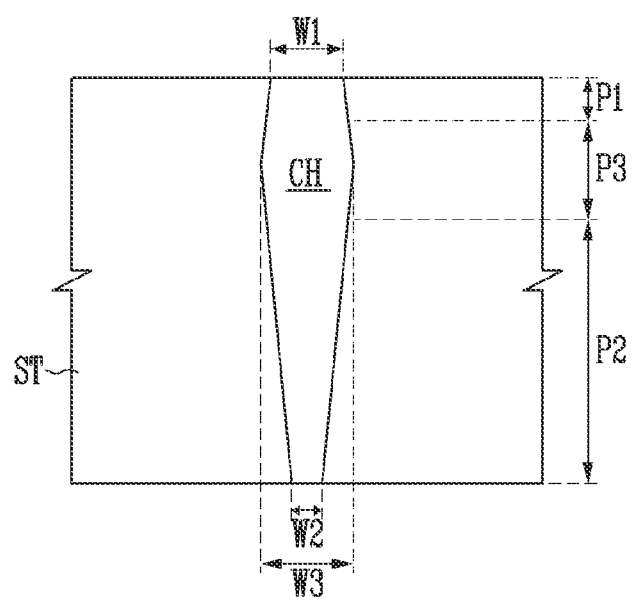

FIG. 1A and FIG. 1B are views illustrating the structure of a semiconductor device according to an embodiment of the present disclosure.

Referring to FIG. 1A, the semiconductor device may include a stacked structure ST and a channel structure CH penetrating the stacked structure ST. The stacked structure ST may include an opening OP, and the channel structure CH may be located in the opening OP.

The stacked structure ST may include alternately stacked conductive layers 11 and insulating layers 12. The conductive layers 11 may be the gate electrodes of memory cells, select transistors, and the like. The conductive layers 11 may include a conductive material, such as polysilicon, tungsten, molybdenum, metal, or the like. The insulating layers 12 are for insulating the stacked conductive layers 11 from each other. The insulating layers 12 may include an insulating material, such as an oxide, a nitride, an air gap, or the like.

The channel structure CH may include a channel layer 17. The channel structure CH may further include a memory layer M, an insulating core 18, or a combination thereof. The channel layer 17 may be a region in which the channel of a memory cell or a select transistor is formed. The channel layer 17 may include a semiconductor material, such as silicon, germanium, a nano structure, or the like. The memory layer M may be interposed between the channel layer 17 and the conductive layers 11. In an embodiment, the memory layer M may be formed to enclose the sidewall of the channel layer 17. The memory layer M may include a tunnel insulating layer, a data storage layer, a blocking layer, or a combination thereof. The data storage layer may include a floating gate, a charge trap material, polysilicon, a nitride, a variable resistance material, a phase-change material, or a combination thereof. The insulating core 18 may be formed in the channel layer 17. The insulating core 18 may include an insulating material, such as an oxide, a nitride, an air gap, or the like.

Referring to FIG. 1A and FIG. 1B, the channel structure CH may penetrate the stacked structure ST in the direction in which the conductive layers 11 and the insulating layers 12 are stacked. The channel structure CH may have a uniform width or have different widths according to the regions. The channel structure CH may include a first part P1, a second part P2, and a third part P3 located therebetween. The first part P1 may have a first width W1, the second part P2 may have a second width W2, and the third part P3 may have a third width W3. The second width W2 may be less than the first width W1. The third width W3 may be greater than the first width W1.

In an embodiment, the first part P1 may be the upper portion of the channel structure CH, and the channel structure CH may have the first width W1 in the upper surface of the stacked structure ST. The second part P2 may be the lower portion of the channel structure CH, and the channel structure CH may have the second width W2 in the lower surface of the stacked structure ST. The third part P3 may be a bowing region, and may have a cross section in a bowing shape. For reference, the upper portion and the lower portion may be relative concepts. The stacked structure ST may be located upside down, in which case the first part P1 may be the lower portion and the second part P2 may be the upper portion.

According to the above-described structure, a memory cell or a select transistor may be located in a region in which the channel structure CH intersects with the conductive layers 11. The memory cells may be stacked along the channel structure CH. Also, even though a notch is caused in the sidewall of the opening OP during a manufacturing process, the channel structure CH may have a flat sidewall.

Figure 2A:
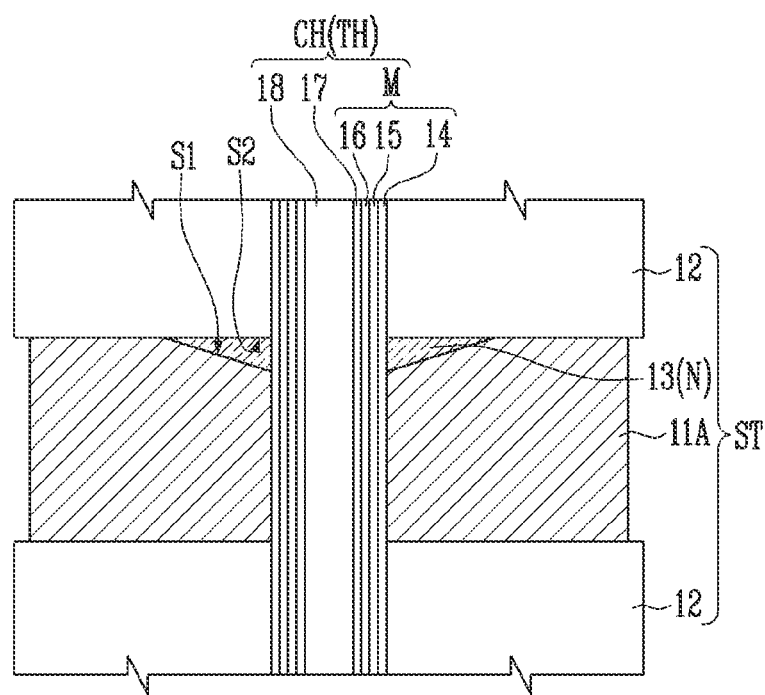
FIG. 2A and FIG. 2B are views illustrating the structure of a semiconductor device according to various embodiments of the present disclosure.
Figure 2B:
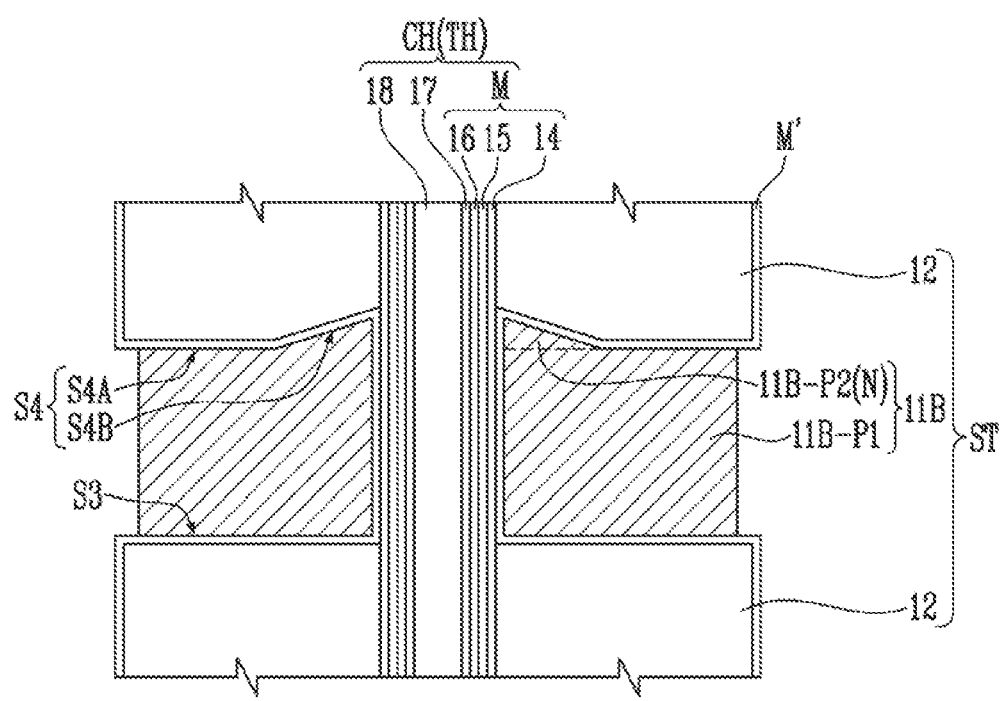

FIG. 2A and FIG. 2B are views illustrating the structure of a semiconductor device according to an embodiment of the present disclosure. FIG. 2A and FIG. 2B may be enlarged views of a part of FIG. 1A. In an embodiment, FIG. 2A may be enlarged view of the bowing region of the channel structure CH. In an embodiment, FIG. 2B may also be an enlarged view of the bowing region of the channel structure CH. A redundant description will be omitted below.

Referring to FIG. 2A and FIG. 2B, the semiconductor device may include a stacked structure ST and a channel structure CH. A through hole TH may pass through the stacked structure ST in the stack direction and the channel structure CH may be located in the through hole TH. The channel structure CH may include a channel layer 17, and may further include a memory layer M or an insulating core 18. The memory layer M may include a blocking layer 14, a data storage layer 15, a tunnel insulating layer 16, or a combination thereof.

Referring to FIG. 2A, the stacked structure ST may include alternately stacked conductive layers 11A and insulating layers 12, and may further include at least one plugging pattern 13. A notch N may be located in at least one of the interfaces of the conductive layers 11A and insulating layers 12, and the plugging pattern 13 may be located in the notch N. The notch N may be located within the bowing region. The plugging pattern 13 may be located within the bowing region. The plugging pattern 13 may be located in at least one of the interfaces of the conductive layers 11A and insulating layers 12. The plugging pattern 13 may be located between the upper surface of the conductive layer 11A and the lower surface of the insulating layer 12, or may be located between the lower surface of the conductive layer 11A and the upper surface of the insulating layer 12.

The plugging pattern 13 may include a first surface S1, facing the conductive layer 11A, and a second surface S2, facing the insulating layer 12, and at least one of the first surface S1 and the second surface S2 may have an inclination. Here, the inclination may indicate that the first surface S1 or the second surface S2 is inclined at a predetermined angle relative to the interface in which neither the notch N nor the plugging pattern 13 is located. In an embodiment, the plugging pattern 13 may include the inclined first surface S1 and the flat second surface S2, may include the inclined first surface S1 and the inclined second surface S2, or may include the flat first surface S1 and the inclined second surface S2. Here, the inclined first surface S1 or the inclined second surface S2 may include a curved surface. The inclination of the first surface S1 and the inclination of the second surface S2 may be substantially equal to each other or different from each other. The inclination of the first surface S1 may be greater than the inclination of the second surface S2.

The plugging pattern 13 may include at least one of a nitride, amorphous silicon, polysilicon and metal. When the plugging pattern 13 includes a conductive material, the plugging pattern 13 may be electrically coupled to the conductive layer 11A. In an embodiment, the plugging pattern 13 may be used as a word line, a select line, or the like along with the conductive layer 11A.

Referring to FIG. 2B, the stacked structure ST may include alternately stacked conductive layers 11B and insulating layers 12. Each of the conductive layers 11B may include a third surface S3, facing the lower insulating layer 12, and a fourth surface S4, facing the upper insulating layer 12. At least one of the third surface S3 and the fourth surface S4 may include an inclined surface. In an embodiment, the fourth surface S4 may include a flat surface S4A and an inclined surface S4B, and the inclined surface S4B may be located closer to the channel structure CH than the flat surface S4A. The inclined surface S4B may include a curved surface. In an embodiment, each of the conductive layers 11B may include a first part 11B_P1 and a second part 11B_P2. The second part 11B_P2 may protrude from the first part 11B_P1 into the insulating layer 12. The second part 11B_P2 may be formed in such a way that the shape of a notch caused during a manufacturing process is transferred to the conductive layer 11B.

The semiconductor device may further include a memory layer M'. The memory layer M' may be interposed between the conductive layers 11B and the insulating layers 12 and between the channel structure CH and the conductive layers 11B. The memory layer M' may include a blocking layer, a data storage layer, a tunnel insulating layer, or a combination thereof.

According to the above-described structure, a memory cell or a select transistor may be located in a region in which the channel structure CH intersects with the conductive layers 11A or 11B. The memory cells may be stacked along the channel structure CH. Also, even though a notch N is caused during a manufacturing process, the channel structure CH may have a flat sidewall.

FIGS. 3A to 3F are views illustrating a method of manufacturing a semiconductor device according to an embodiment of the present disclosure. A redundant description will be omitted below.

Figure 3A:
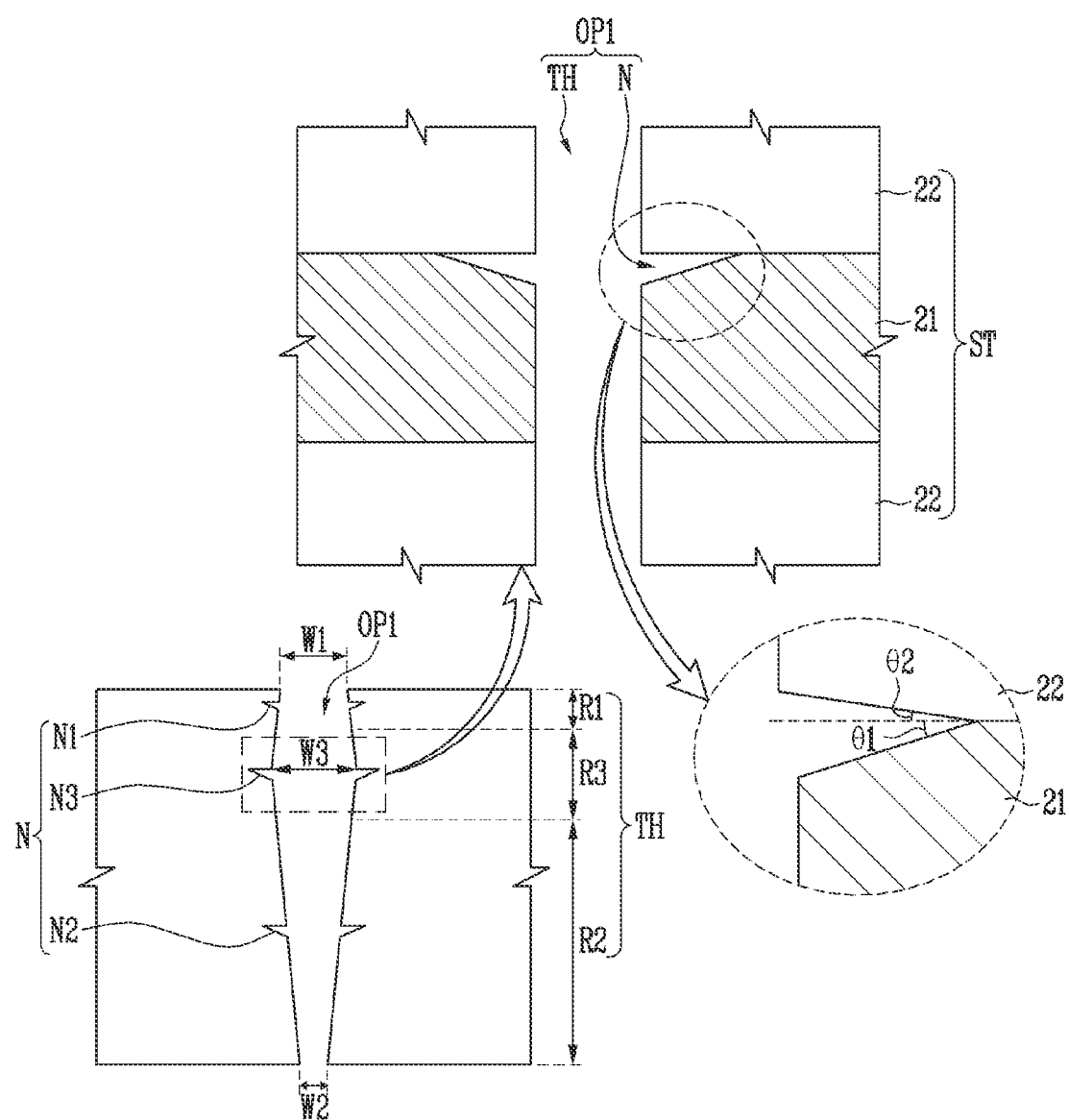
FIGS. 3A, 3B, 3C, 3D, 3E, and 3F are views illustrating a method of manufacturing a semiconductor device according to an embodiment of the present disclosure.

Referring to FIG. 3A, a stacked structure ST is formed. The stacked structure ST may include alternately stacked first material layers 21 and second material layers 22. The first material layers 21 may include a material having a higher etching selectivity than the material of the second material layers 22. For example, the first material layers 21 may include a sacrifice material, such as a nitride or the like, and the second material layers 22 may include an insulating material, such as an oxide or the like. In an example, the first material layers 21 may include a conductive material, such as polysilicon, tungsten, molybdenum, or the like, and the second material layers 22 may include an insulating material, such as an oxide or the like.

Subsequently, a first opening OP1 passing through the stacked structure ST is formed. The first opening OP1 may have a plane in the shape of a circle, an ellipse, a polygon, or the like. In an embodiment, a plurality of first openings OP1 arranged in a first direction and a second direction intersecting with the first direction may be formed.

The first opening OP1 may include a through hole TH and a notch N. The through hole TH may pass through the stacked structure ST in the stack direction. The through hole TH may have a uniform width or different widths according to the regions. The through hole TH may include a first region R1, a second region R2, and a third region R3 located between the first region R1 and the second region R2. The first region R1 may have a first width W1, the second region R2 may have a second width W2, and the third region R3 may have a third width W3. The second width W2 may be less than the first width W1. The third width W3 may be greater than each of the first width W1 and the second width W2.

In an embodiment, the first region R1 may be the upper portion of the through hole TH, and the through hole TH may have the first width W1 in the upper surface of the stacked structure ST. The second region R2 may be the lower portion of the through hole TH, and the through hole TH may have the second width W2 in the lower surface of the stacked structure ST. The third region R3 may be a bowing region, and may have a cross section in a bowing shape.

The notch N may be coupled to the through hole TH, and may protrude into the stacked structure ST. The notch N may include at least one of a first notch N1 coupled to the first region R1, a second notch N2 coupled to the second region R2 and a third notch N3 coupled to the third region R3.

Referring to the enlarged view, the notch N may be located in at least one of the interfaces of the first material layers 21 and second material layers 22. The notch N may be located between the upper surface of the first material layer 21 and the lower surface of the second material layer 22, or may be located between the lower surface of the first material layer 21 and the upper surface of the second material layer 22. In the interface in which the notch N is located, at least one of the first material layer 21 and the second material layer 22 may have an inclination. In an embodiment, the notch N may be defined by the inclined surface of the first material layer 21 and the flat surface of the second material layer 22, may be defined by the inclined surface of the first material layer 21 and the inclined surface of the second material layer 22, or may be defined by the flat surface of the first material layer 21 and the inclined surface of the second material layer 22. Here, the inclined surface may include a curved surface. The inclination of the surface of the first material layer 21 and the inclination of the surface of the second material layer 22 may be substantially equal to or different from each other. The inclination θ1 of the surface of the first material layer 21 may be greater than the inclination θ2 of the surface of the second material layer 22 (θ1>θ2). Due to the notch N, the inner surface of the first opening OP1 may have an abnormal profile.

Figure 3B:
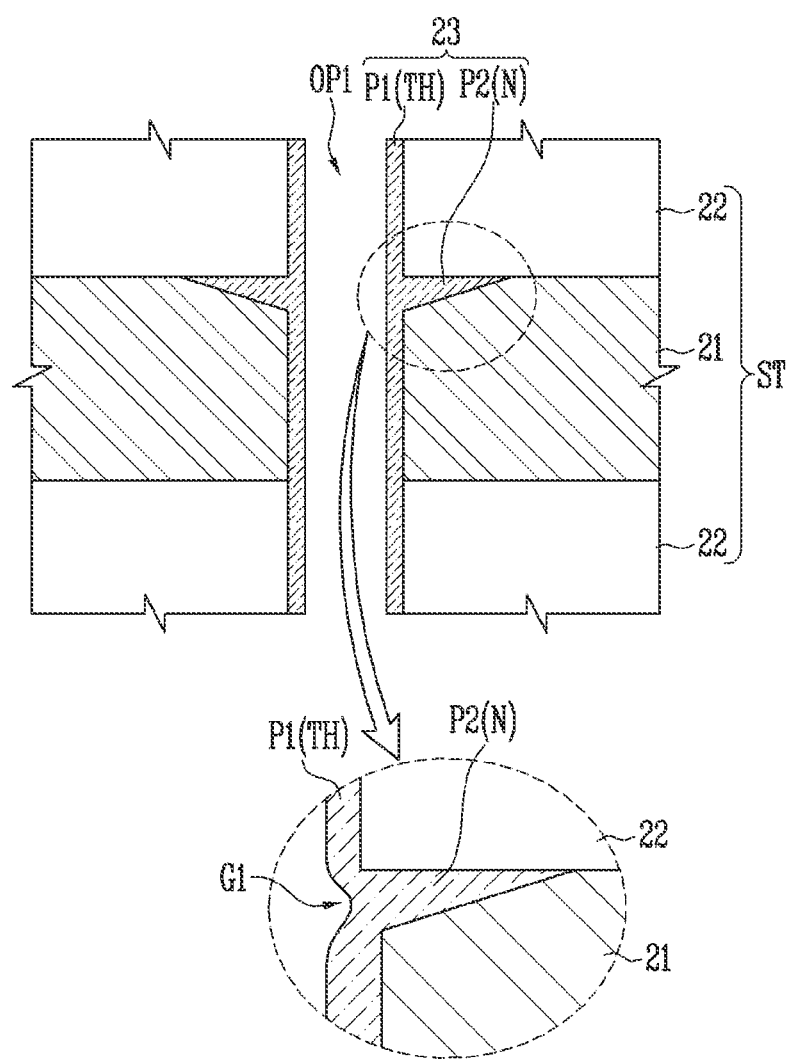

Referring to FIG. 3B, a sacrificial layer 23 is formed in the first opening OP1. The sacrificial layer 23 may include a first part P1 and a second part P2 coupled to the first part P1. The first part P1 may be located in the through hole TH, and the second part P2 may be located in the notch N.

The sacrificial layer 23 may be formed to fill the notch N, and may be formed along the inner surface of the first opening OP1. The inner surface of the sacrificial layer 23 may be substantially flat. Referring to the enlarged view, the sacrificial layer 23 may include a first groove G1 in a portion corresponding to the notch N.

The sacrificial layer 23 may include a material having a higher etching selectivity than the material of the second material layers 22. The sacrificial layer 23 may include a nitride, amorphous silicon, or a combination thereof. In an embodiment, the first material layers 21 may include a nitride, the second material layers 22 may include an oxide, and the sacrificial layer 23 may include a nitride or amorphous silicon. In an embodiment, the sacrificial layer 23 may include the substantially same material as the first material layers 21. Here, the "substantially same material" may indicate that the chemical composition is identical or the property, such as an etching rate or the like, is identical or similar.

Figure 3C:
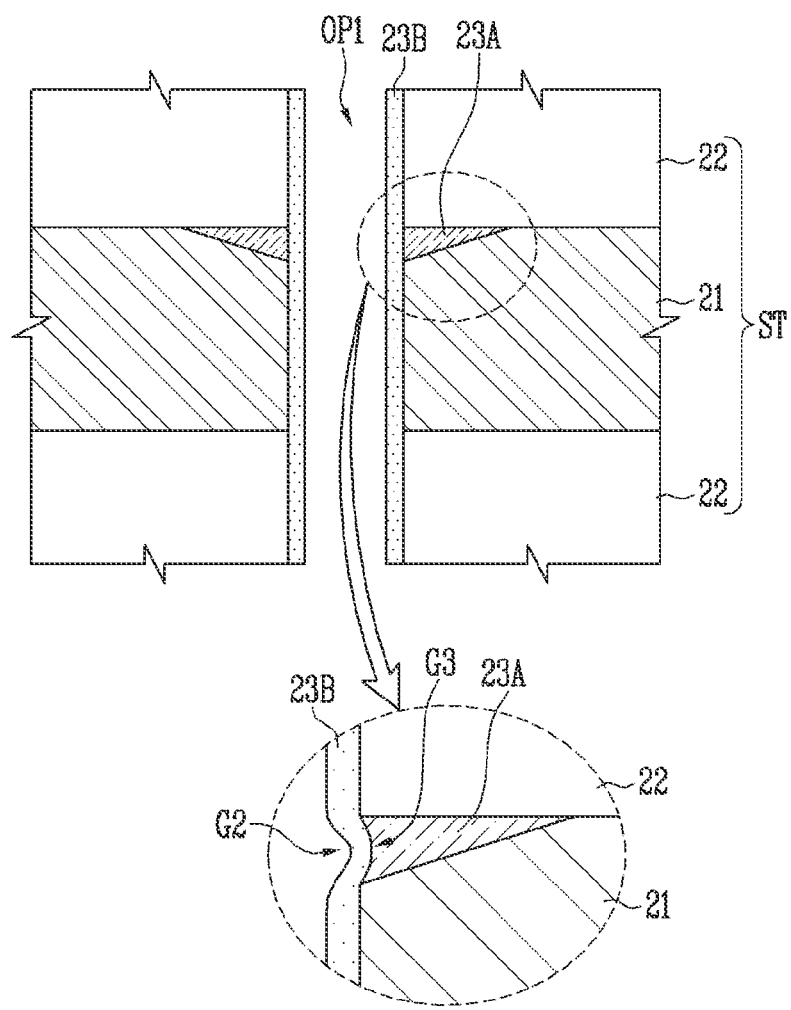

Referring to FIG. 3C, a plugging pattern 23A is formed by oxidizing a portion of the sacrificial layer 23. The first part P1 of the sacrificial layer 23 is selectively oxidized, and the second part P2 may be maintained in the state in which it is not oxidized. The oxidized first part P1 may be a sacrificial pattern 23B, and the second part P2, which is maintained in the state in which it is not oxidized, may be the plugging pattern 23A. The sacrificial pattern 23B may be an oxide layer, and may be located in the through hole TH. The plugging pattern 23A may include the same material as the sacrificial layer 23, and may be located in the notch N. Referring to the enlarged view, the sacrificial pattern 23B may include a second groove G2 in a portion corresponding to the plugging pattern 23A. The plugging patter 23A may include a third groove G3 on the surface that comes into contact with the sacrificial pattern 23B.

The plugging pattern 23A may protrude into the stacked structure ST in the interface of the first material layer 21 and second material layer 22. Because the plugging pattern 23A fills the notch N, the abnormal profile of the first opening OP1 may be compensated for. Accordingly, the inner surface of the first opening OP1 may have a substantially flat profile.

Figure 3D:
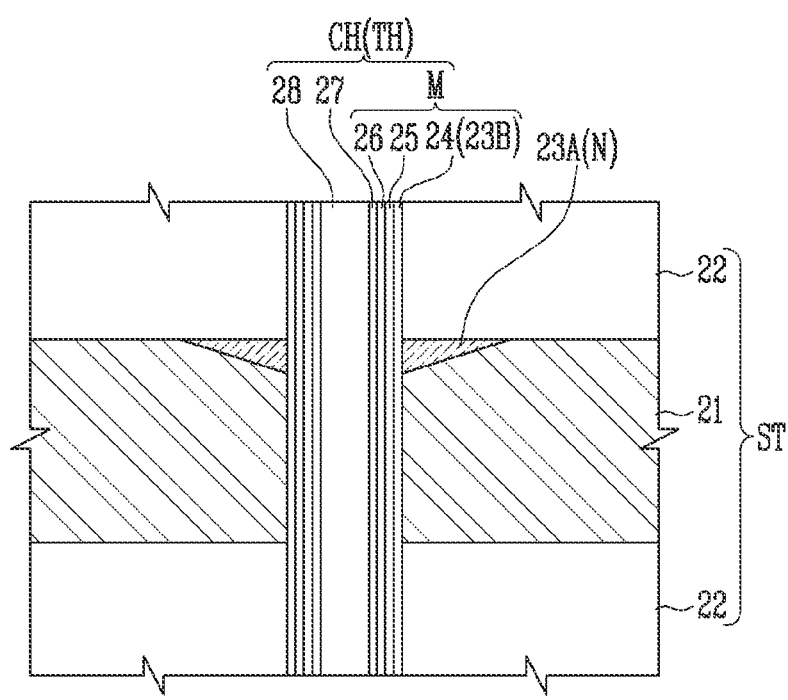

Referring to FIG. 3D, a memory layer M is formed in the first opening OP1. The memory layer M may include a blocking layer 24, a data storage layer 25, a tunnel insulating layer 26, or a combination thereof. The data storage layer 25 may include a floating gate, a charge trap material, polysilicon, a nitride, a variable resistance material, a phase-change material, a nano structure, or the like. The tunnel insulating layer 26 may include an oxide.

In an embodiment, the blocking layer 24 may be formed after the sacrificial pattern 23B is removed. After a seed layer, such as a nitride layer or the like, is formed in the first opening OP1, the seed layer is oxidized, whereby the blocking layer 24 may be formed. Alternatively, the blocking layer 24 may be formed by depositing a high dielectric constant (high-k) material.

In an embodiment, it is possible to use the sacrificial pattern 23B as the blocking layer 24, rather than removing the sacrificial pattern 23B. Here, in order to form the blocking layer 24 having a sufficient thickness, a seed layer may be used. For example, after a seed layer is formed on the first part P1, the seed layer and the first part P1 are oxidized together, whereby the sacrificial pattern 23B may be formed. Alternatively, after a seed layer is formed on the sacrificial pattern 23B, the seed layer is oxidized, whereby the oxide layer may be formed. In this case, the oxide layer and the sacrificial pattern 23B may be used as the blocking layer 24.

Subsequently, a channel layer 27 is formed in the first opening OP1. The channel layer 27 may include a semiconductor material, such as silicon (Si), germanium (Ge), a nano structure, or the like. An insulating core 28 may be additionally formed in the channel layer 27. The insulating core 28 may include an insulating material, such as an oxide, a nitride, an air gap, or the like.

Because the memory layer M and the channel layer 27 are formed after the plugging pattern 23A is formed in the notch N, the memory layer M and the channel layer 27 may be formed in the through hole TH without protruding into the notch N. The memory layer M and the channel layer 27 may be formed along the inner surface of the first opening OP1, which is corrected by the plugging pattern 23A. The corrected inner surface of the first opening OP1 may be substantially flat, and thus the channel structure CH may have a substantially flat sidewall.

Figure 3E:
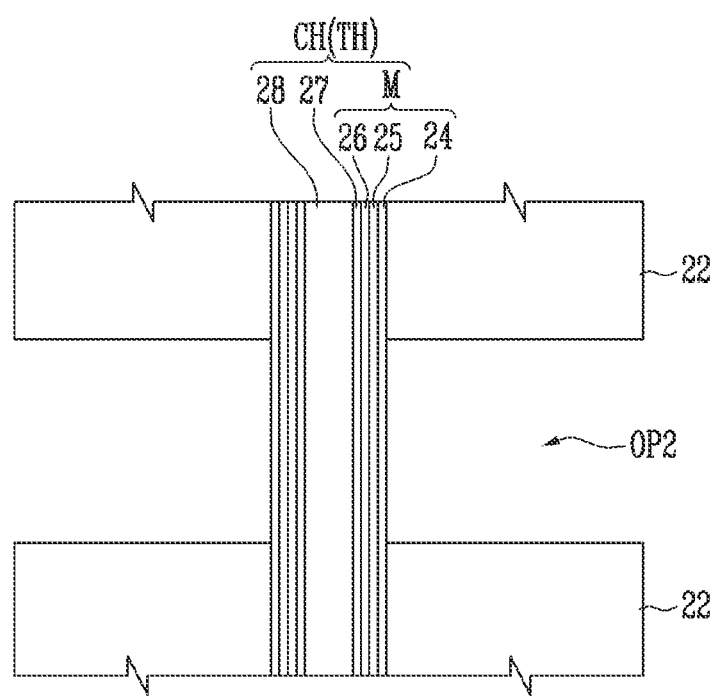
Figure 3F:
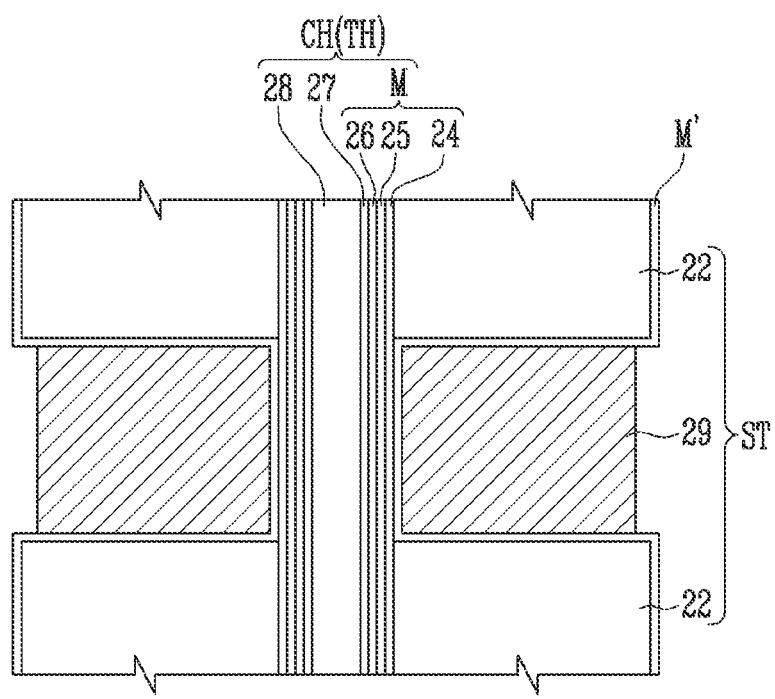

Referring to FIG. 3E and FIG. 3F, the plugging pattern 23A and the first material layers 21 are replaced with third material layers 29.

In an embodiment, when the first material layers 21 include a sacrifice material and when the second material layers 22 include an insulating material, the first material layers 21 may be replaced with conductive layers. In this case, the third material layers 29 may include a conductive material, such as polysilicon, tungsten, molybdenum, metal, or the like. First, referring to FIG. 3E, second openings OP2 are formed by removing the plugging pattern 23A and the first material layers 21.

The second openings OP2 may be formed by selectively etching the plugging pattern 23A and the first material layers 21. For reference, it is possible to form the second openings OP2 by remaining the plugging pattern 23A and removing the first material layers 21. Subsequently, referring to FIG. 3F, the third material layers 29 are formed in the second openings OP2. Before the third material layers 29 are formed, a memory layer M' may be additionally formed. The memory layer M' may include a tunnel insulating layer, a data storage layer, a blocking layer, or a combination thereof.

In an embodiment, when the first material layers 21 include conductive layers and when the second material layers 22 include an insulating material, the first material layers 21 may be silicified. In this case, the third material layers 29 may include a metal silicide.

According to the above-described manufacturing method, the channel structure CH may be prevented from extending into the notch N. If the channel structure CH extends into the notch N, charges may be trapped in the data storage layer 25 in the notch N. Due to the profile of the notch N, an effective gate length may increase. Cell distribution, disturbance characteristics, retention characteristics, and the like may be deteriorated, and the reliability of the semiconductor device may be degraded. According to an embodiment of the present disclosure, because the inner surface profile of the first opening OP1 is corrected by the plugging pattern 23A, the effective gate length may be prevented from increasing or an increase in the effective gate length may be minimized. Also, cell distribution, disturbance characteristics, retention characteristics, reliability, and the like may be improved.

FIGS. 4A to 4E are views illustrating a method of manufacturing a semiconductor device according to an embodiment of the present disclosure. A redundant description will be omitted below.

Figure 4A:
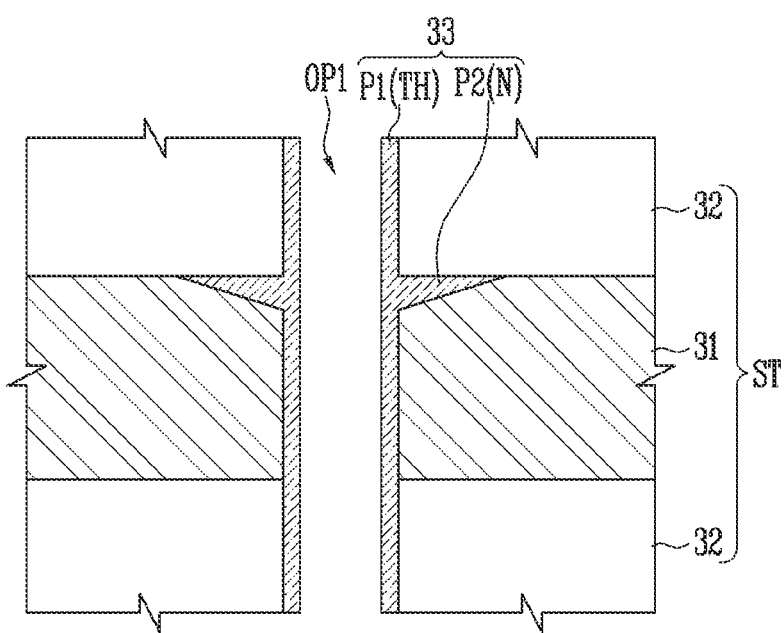
FIGS. 4A, 4B, 4C, 4D, and 4E are views illustrating a method of manufacturing a semiconductor device according to an embodiment of the present disclosure.

Referring to FIG. 4A, a stacked structure ST is formed. The stacked structure ST may include alternately stacked first material layers 31 and second material layers 32. The first material layers 31 may include a material having a higher etching selectivity than the material of the second material layers 32. Subsequently, a first opening OP1 passing through the stacked structure ST is formed. The first opening OP1 may include a through hole TH and a notch N.

Subsequently, a sacrificial layer 33 is formed in the first opening OP1. The sacrificial layer 33 may include a first part P1 and a second part P2 coupled to the first part P1. The first part P1 may be located in the through hole TH, and the second part P2 may be located in the notch N.

Figure 4B:
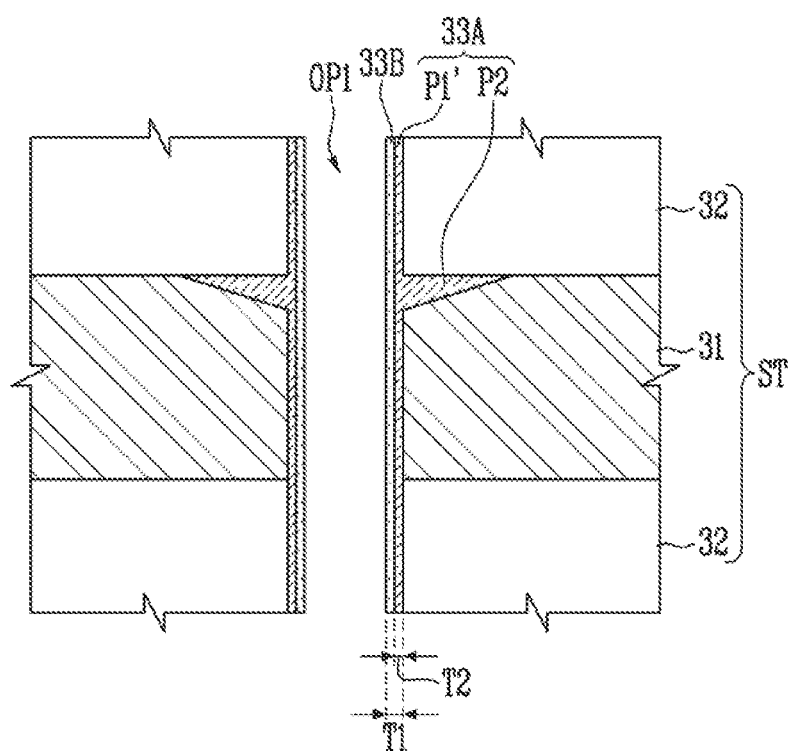

Referring to FIG. 4B, a first sacrificial pattern 33B is formed by oxidizing a portion of the sacrificial layer 33. A portion of the first part P1 of the sacrificial layer 33 may be oxidized. The surface of the first part P1 is oxidized, whereby the thickness T1 of the first part P1 may be decreased. The remaining sacrificial layer 33A without being oxidized may include a first part P1' and the second part P2. The first part P1' may have a thickness T2 smaller than the thickness T1.

Figure 4C:
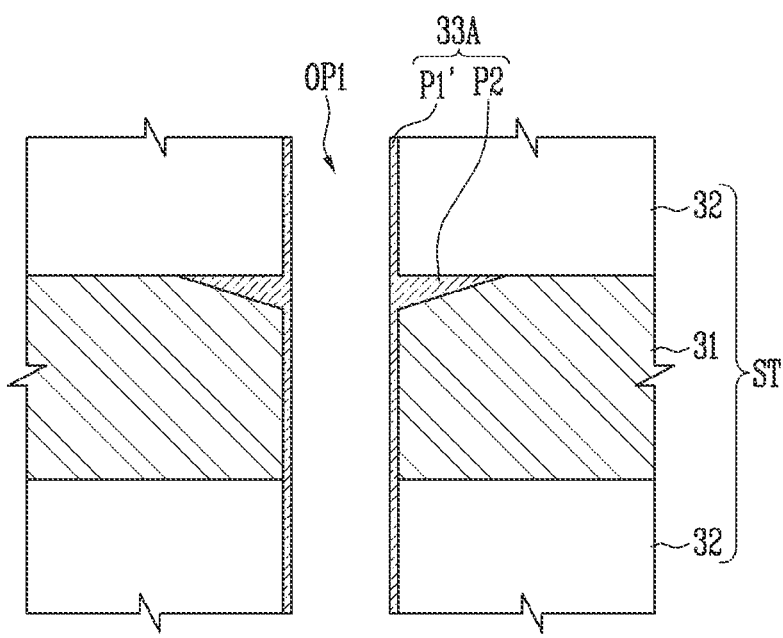
Figure 4D:
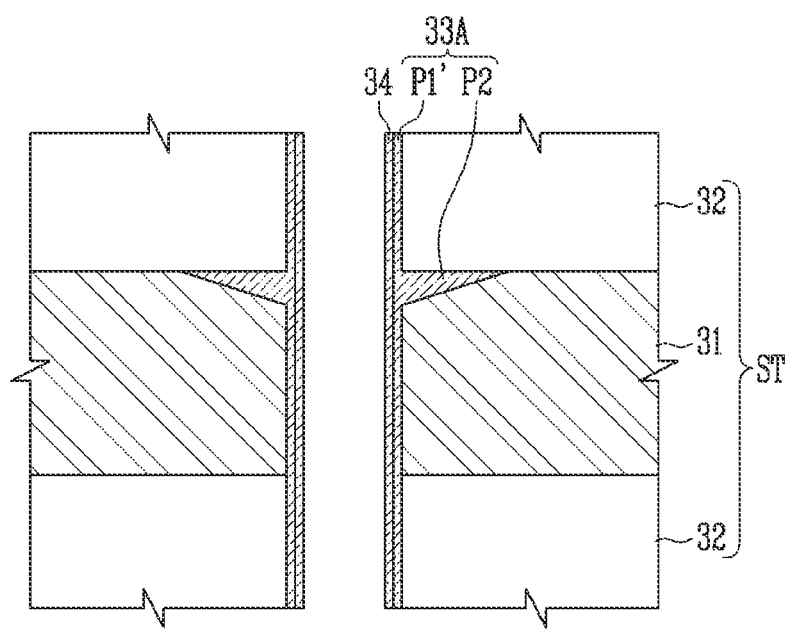
Figure 4E:
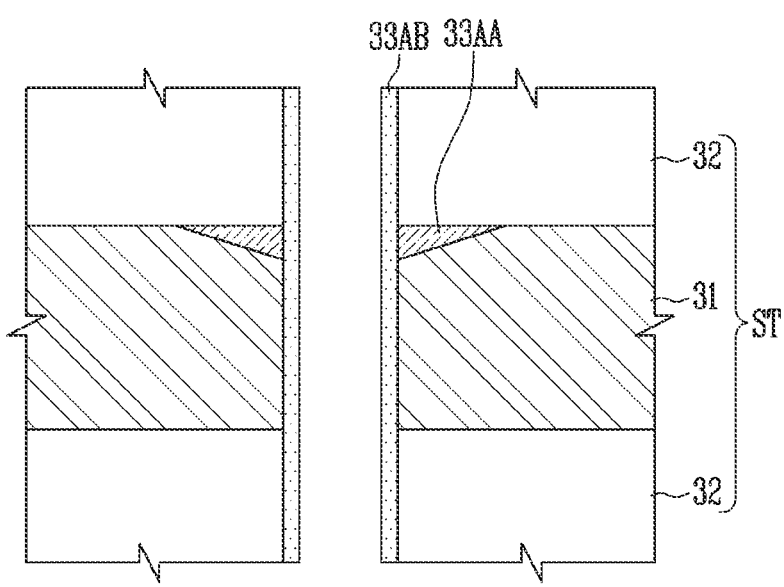

Referring to FIG. 4C, the first sacrificial pattern 33B is removed. Accordingly, the sacrificial layer 33A is exposed. Referring to FIG. 4D, a seed layer 34 is formed on the first part P1'. The seed layer 34 may include a nitride. Referring to FIG. 4E, a plugging pattern 33AA is formed by oxidizing a portion of the sacrificial layer 33A. In an embodiment, the seed layer 34 and the first part P1' of the sacrificial layer 33A are oxidized, whereby a second sacrificial pattern 33AB may be formed. The second part P2 of the sacrificial layer 33A may be remained, rather than being oxidized. The remaining second part P2 may be the plugging pattern 33AA. The plugging pattern 33AA may be located in the notch N, and may protrude into the stacked structure ST in the interface of the first material layer 31 and second material layer 32. For reference, the seed layer 34 is formed after the second sacrificial pattern 33AB is formed, and the seed layer 34 is oxidized, whereby an oxide layer may be additionally formed on the second sacrificial pattern 33AB. Alternatively, forming the seed layer 34 may be omitted.

Subsequently, the following process for forming a memory layer, a channel layer, and the like may be performed. The following process may be the same as or similar to the description made with reference to FIGS. 3D to 3F.

According to the above-described manufacturing method, the first sacrificial pattern 33B is formed by partially oxidizing the sacrificial layer 33, and the first sacrificial pattern 33B is removed, whereby the thickness of the first part P1 of the sacrificial layer 33 may be adjusted. Also, the seed layer 34 is formed and oxidized, whereby the thickness of the second sacrificial pattern 33AB may be adjusted.

FIGS. 5A to 5D are views illustrating a method of manufacturing a semiconductor device according to an embodiment of the present disclosure. A redundant description will be omitted below.

Figure 5A:
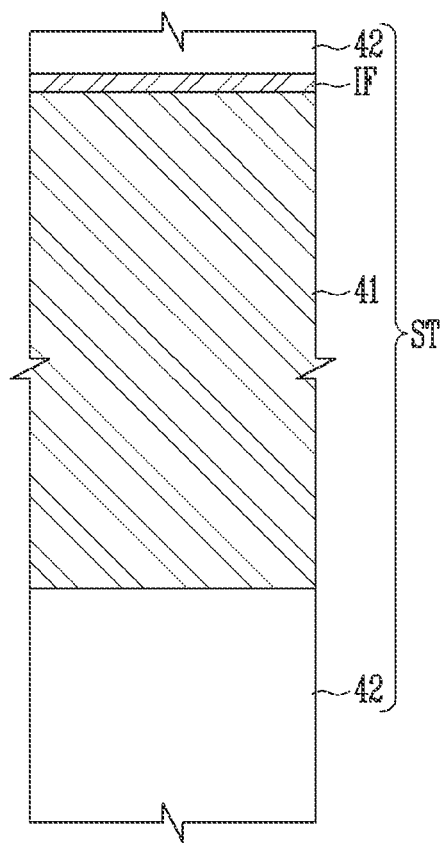
FIGS. 5A, 5B, 5C, and 5D are views illustrating a method of manufacturing a semiconductor device according to an embodiment of the present disclosure.

Referring to FIG. 5A, a stacked structure ST is formed. The stacked structure ST may include alternately stacked first material layers 41 and second material layers 42. The stacked structure ST may include interfaces between the first material layers 41 and the second material layers 42, and the interfaces may have a property that is different from the properties of the first material layers 41 and second material layers 42.

The stacked structure ST may be formed by alternately depositing the first material layers 41 and the second material layers 42. In the process of depositing the second material layer 42 on the first material layer 41, an interface layer IF having a property that is diffident from the property of the first material layer 41 may be formed on the surface of the first material layer 41. In an embodiment, when the second material layer 42 including an oxide layer is deposited on the first material layer 41 including a nitride layer, a silicon-rich (Si-rich) interface may be formed on the surface of the nitride layer due to the oxidizing power of $O_2$ gas. The interface layer IF may have a chemical composition different from that of the first material layer 41, and may have an etching rate different from that of the first material layer 41. The concentration of silicon in the interface layer IF may be higher than the concentration of silicon in the first material layer 41. The interface layer IF may have a higher etching rate than the first material layer 41.

Figure 5B:
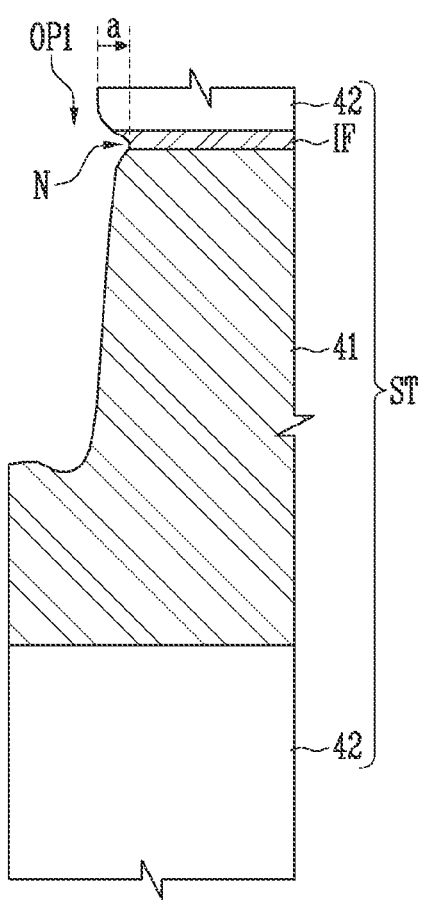
Figure 5C:
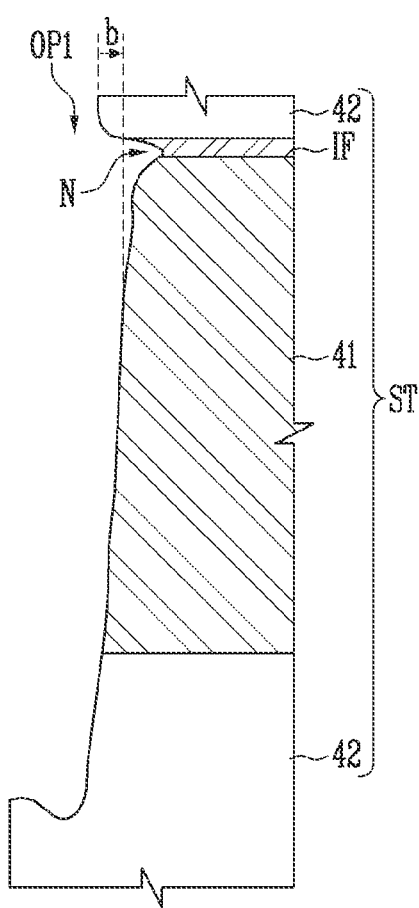
Figure 5D:
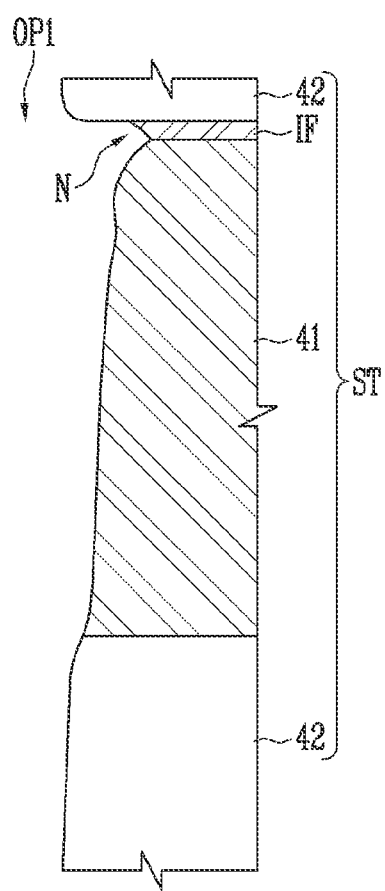

Referring to FIGS. 5B to 5D, a first opening OP1 passing through the stacked structure ST is formed. The first opening may be formed by sequentially etching the alternately stacked first material layers 41 and second material layers 42.

First, referring to FIG. 5B, the second material layer 42, the interface layer IF, and the first material layer 41 are sequentially etched. Depending on the etching rates of the second material layer 42, the interface layer IF, and the first material layer 41, the degrees of etching in the horizontal direction may be different. The etching rate of the interface layer IF may be higher than that of the first material layer 41, and the interface layer IF may be further etched in the horizontal direction compared to the first material layer 41 (as marked with reference numeral "a"). Accordingly, a notch N protruding into the interface layer IF may be formed. Due to the notch N, the inner surface of the first opening OP1 has an abnormal profile.

Subsequently, referring to FIG. 5C and FIG. 5D, the first material layer 41 and the second material layer 42 are sequentially etched. As the etching process proceeds, the notch N may further protrude into the interface layer IF. The first material layers 41 may be further etched in the horizontal direction compared to the second material layers 42 (as marked with reference numeral "b").

Subsequently, the following process for forming a sacrificial layer, a plugging pattern, a memory layer, a channel layer, and the like may be performed. The following process may be the same as or similar to the description made with reference to FIGS. 3A to 3F or FIGS. 4A to 4E.

According to the above-described manufacturing method, even though the notch N is caused by the interface layer IF, the abnormal profile of the first opening OP1 may be compensated for by the plugging pattern.

Figure 6:
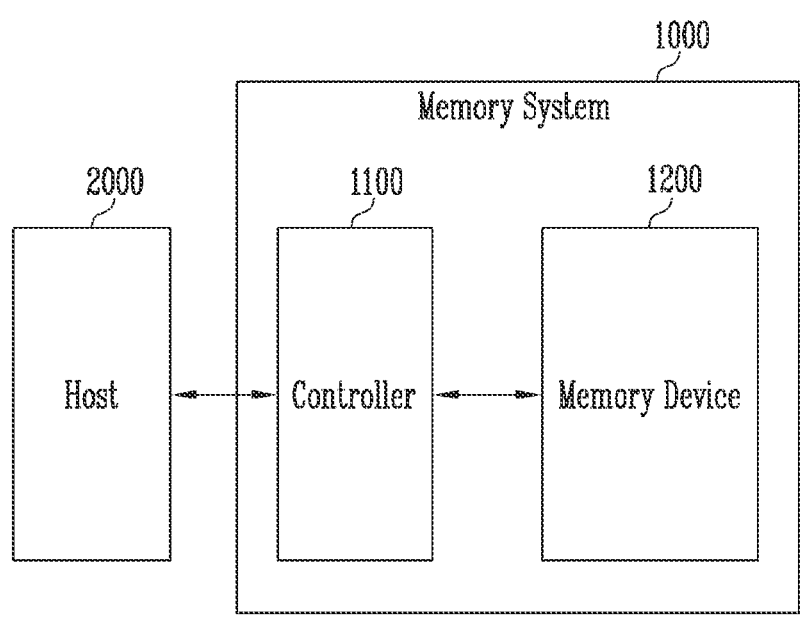
FIG. 6 is a diagram illustrating a memory system according to an embodiment of the present disclosure.

FIG. 6 is a view illustrating a memory system according to an embodiment of the present disclosure.

Referring to FIG. 6, the memory system 1000 may include a memory device 1200 in which data is stored and a controller 1100 that communicates between the memory device 1200 and a host 2000.

The host 2000 may be a device or system configured to store data in the memory system 1000 or to retrieve data from the memory system 1000. The host 2000 may generate requests for various operations, and may output the generated requests to the memory system 1000. The requests may include a program request for a program operation, a read request for a read operation, an erase request for an erase operation, and the like. The host 2000 may communicate with the memory system 1000 through any of various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), Integrated Drive Electronics (IDE) and the like.

The host 2000 may include at least one of a computer, a portable digital device, a tablet PC, a digital camera, a digital audio player, a television, a wireless communication device, and a cellular phone, but embodiments of the present disclosure are not limited thereto.

The controller 1100 may control the overall operation of the memory system 1000. The controller 1100 may control the memory device 1200 in response to a request from the host 2000. The controller 1100 may control the memory device 1200 such that a program operation, a read operation, an erase operation, or the like is performed in response to a request from the host 2000, or the controller 1100 may perform a background operation for improving the performance of the memory system 1000 even though there is no request from the host 2000.

The controller 1100 may transmit a control signal and a data signal to the memory device 1200 in order to control the operation of the memory device 1200. The control signal and the data signal may be transmitted to the memory device 1200 through different input/output lines. The data signal may include a command, an address or data. The control signal may be used in order to identify a section in which a data signal is input.

The memory device 1200 may perform a program operation, a read operation, an erase operation, or the like under the control of the controller 1100. The memory device 1200 may be implemented as a volatile memory device, in which stored data is erased when the supply of power is interrupted, or as a nonvolatile memory device, in which stored data is retained even though the supply of power is interrupted. The memory device 1200 may have the structures described with reference to FIGS. 1A to 2B. The memory device 1200 may be a semiconductor device that is manufactured using the manufacturing methods described with reference to FIGS. 3A to 5D. In an embodiment, the semiconductor device may include a stacked structure including alternately stacked conductive layers and insulating layers, a channel structure penetrating the stacked structure, and a plugging pattern located in at least one of the interfaces of the conductive layers and insulating layers and including a first surface, facing the conductive layer, and a second surface, facing the insulating layer, at least one of the first surface and the second surface having an inclination.

Figure 7:
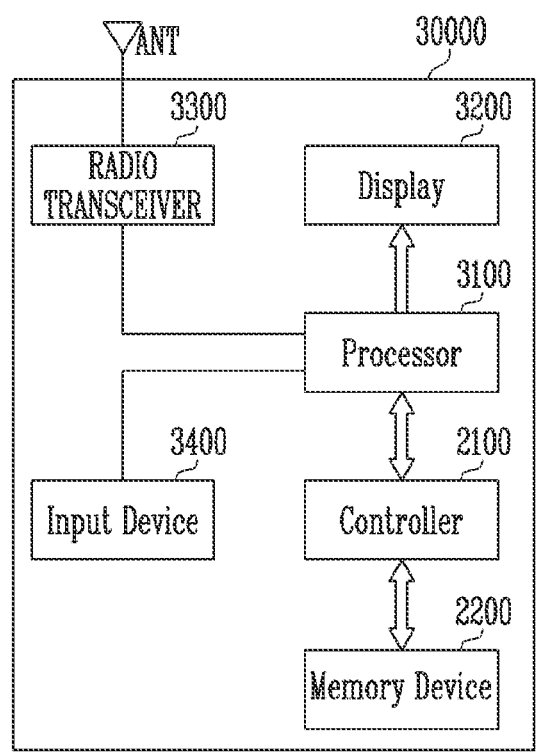
FIG. 7 is a diagram illustrating a memory system according to an embodiment of the present disclosure.

FIG. 7 is a diagram illustrating a memory system according to an embodiment of the present disclosure.

Referring to FIG. 7, a memory system 30000 may be implemented as a cellular phone, a smartphone, a tablet, a personal computer (PC), a personal digital assistant (PDA) or a wireless communication device. The memory system 30000 may include a memory device 2200 and a controller 2100 that is capable of controlling the operation of the memory device 2200.

The controller 2100 may control a data access operation of the memory device 2200, for example, a program operation, an erase operation or a read operation, under the control of a processor 3100.

Data programmed to the memory device 2200 may be output via a display 3200 under the control of the controller 2100.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the controller 2100 or the display 3200. The controller 2100 may transmit the signals processed by the processor 3100 to the memory device 2200. Further, the radio transceiver 3300 may change signals output from the processor 3100 into radio signals, and output the changed radio signals to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 so that data output from the controller 2100, data output from the radio transceiver 3300, or data output from the input device 3400 is output via the display 3200.

In accordance with an embodiment, the controller 2100 that is capable of controlling the operation of the memory device 2200 may be implemented as a part of the processor 3100 or as a chip provided separately from the processor 3100.

Figure 8:
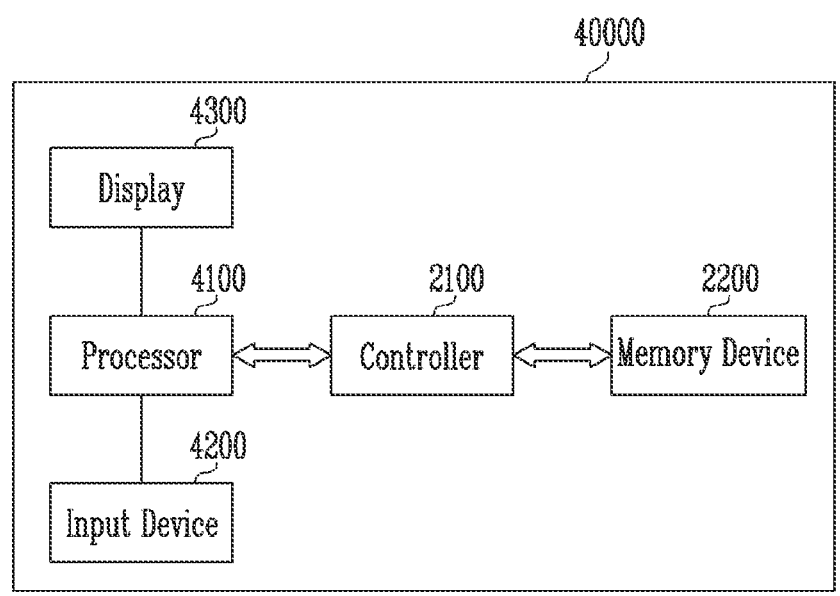
FIG. 8 is a diagram illustrating a memory system according to an embodiment of the present disclosure.

FIG. 8 is a diagram illustrating a memory system according to an embodiment of the present disclosure.

Referring to FIG. 8, a memory system 40000 may be embodied in a personal computer, a tablet, a net-book, an e-reader, a personal digital assistant (PDA), a portable multimedia player (PMP), an MP3 player, or an MP4 player.

The memory system 40000 may include a memory device 2200 and a controller 2100 that is capable of controlling a data processing operation of the memory device 2200.

Further, a processor 4100 may output data, stored in the memory device 2200, via a display 4300 according to data input through an input device 4200. For example, the input device 4200 may be implemented as a pointing device such as a touch pad or a computer mouse, a keypad or a keyboard.

The processor 4100 may control the overall operation of the memory system 40000, and may control the operation of the controller 2100. In an embodiment, the controller 2100 that is capable of controlling the operation of the memory device 2200 may be implemented as a part of the processor 4100 or as a chip provided separately from the processor 4100.

Figure 9:
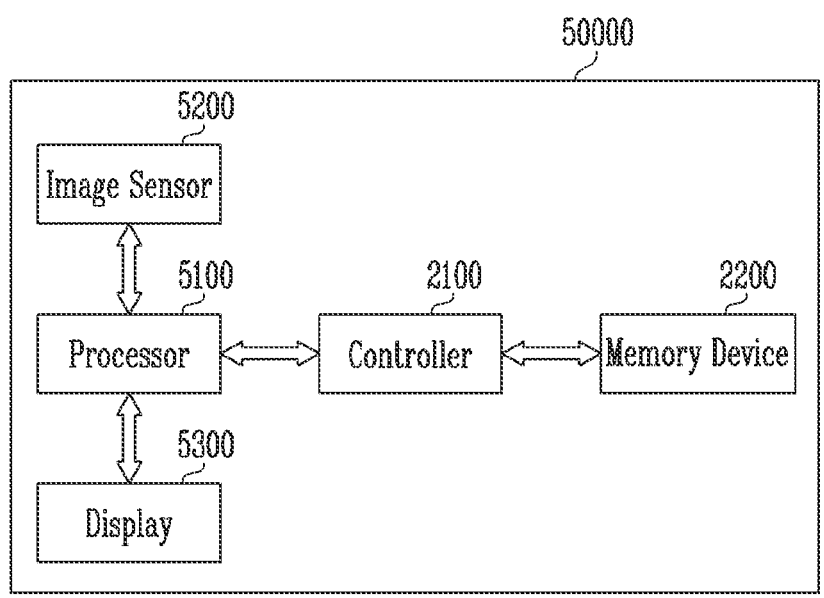
FIG. 9 is a diagram illustrating a memory system according to an embodiment of the present disclosure.

FIG. 9 is a diagram illustrating a memory system according to an embodiment of the present disclosure.

Referring to FIG. 9, a memory system 50000 may be embodied in an image processing device, e.g., a digital camera, a mobile phone provided with a digital camera, a smartphone provided with a digital camera, or a tablet provided with a digital camera.

The memory system 50000 may include a memory device 2200 and a controller 2100 which may control a data processing operation of the memory device 2200, for example, a program operation, an erase operation or a read operation.

An image sensor 5200 of the memory system 50000 may convert an optical image into digital signals, and the converted digital signals may be transmitted to a processor 5100 or the controller 2100. Under the control of the processor 5100, the converted digital signals may be output via a display 5300 or may be stored in the memory device 2200 through the controller 2100. Further, data stored in the memory device 2200 may be output via the display 5300 under the control of the processor 5100 or the controller 2100.

In an embodiment, the controller 2100 that is capable of controlling the operation of the memory device 2200 may be implemented as a part of the processor 5100 or as a chip provided separately from the processor 5100.

Figure 10:
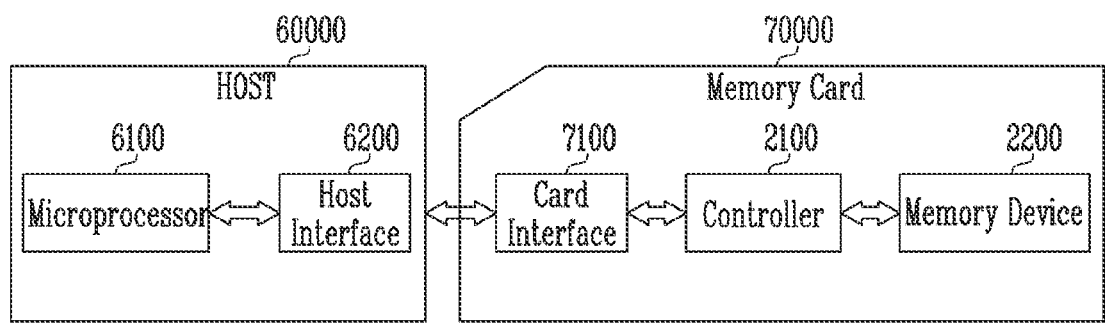
FIG. 10 is a diagram illustrating a memory system according to an embodiment of the present disclosure.

FIG. 10 is a diagram illustrating a memory system according to an embodiment of the present disclosure.

Referring to FIG. 10, a memory system 70000 may be implemented as a memory card or a smart card. The memory system 70000 may include a memory device 2200, a controller 2100, and a card interface 7100.

The controller 2100 may control data exchange between the memory device 2200 and the card interface 7100. In an embodiment, the card interface 7100 may be, but is not limited to, a secure digital (SD) card interface or a multi-media card (MMC) interface.

The card interface 7100 may interface data exchange between a host 60000 and the controller 2100 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000, such as a PC, a tablet, a digital camera, a digital audio player, a cellular phone, console video game hardware or a digital set-top box, the host interface 6200 may perform data communication with the memory device 2200 through the card interface 7100 and the controller 2100 under the control of a microprocessor 6100.

The degree of integration of a semiconductor device may be improved by stacking memory cells in 3D. Also, a semiconductor device having a stable structure and improved reliability may be provided.

What is claimed is:

1. A method of manufacturing a semiconductor device, comprising:
    forming a stacked structure including alternately stacked first material layers and second material layers;
    forming a first opening including a through hole passing through the stacked structure and a notch coupled to the through hole and located in at least one of interfaces of the first material layers and second material layers;
    forming a sacrificial layer including a first part contacting an inner surface of the through hole and a second part protruding from the first part into the notch; and
    oxidizing the first part of the sacrificial layer and thereby forming a first sacrificial pattern contacting the inner surface of the through hole and a plugging pattern filling the notch.

2. The method according to claim 1, wherein, in the at least one of the interfaces, at least one of the first material layer and the second material layer has an inclination, and
    wherein the plugging pattern contacts an upper surface of one of the first material layers and a lower surface of one of the second material layers.

3. The method according to claim 1, wherein the through hole includes a first region having a first width, a second region having a second width, and a third region located between the first and second regions and having a third width that is greater than each of the first and second widths.

4. The method according to claim 3, wherein the notch includes at least one of a first notch coupled to the first region, a second notch coupled to the second region, and a third notch coupled to the third region.

5. The method according to claim 1, further comprising:
    forming a seed layer on the first part,
    wherein the seed layer is oxidized together with the first part while the first part is oxidized to form the first sacrificial pattern.

6. The method according to claim 1, further comprising:
    forming a seed layer on the first sacrificial pattern; and
    forming an oxide layer by oxidizing the seed layer.

7. The method according to claim 1, further comprising:
    forming a second sacrificial pattern by oxidizing a portion of the first part of the sacrificial layer before forming the first sacrificial pattern and the plugging pattern; and
    removing the second sacrificial pattern.

8. The method according to claim 7, wherein forming the second sacrificial pattern is configured to oxidize a surface of the first part in order to decrease a thickness of the first part.

9. The method according to claim 1, wherein forming the first sacrificial pattern and the plugging pattern is configured to form the plugging pattern by maintaining the second part of the sacrificial layer in a state in which the second part is not oxidized.

10. The method according to claim 1, further comprising:
    forming second openings by removing the plugging pattern and the first material layers; and
    forming third material layers in the second openings.

11. The method according to claim 1, wherein the sacrificial layer and the first material layers include a material having a higher etching selectivity than a material included in the second material layers.

12. The method according to claim 1, further comprising:
    forming a memory layer in the through hole after forming the plugging pattern; and
    forming a channel layer surrounded by the memory layer.

13. A method of manufacturing a semiconductor device, comprising:
    forming a stacked structure;
    forming a first opening passing through the stacked structure and including a first region, a second region, a bowing region located between the first and second regions, and a notch coupled to the bowing region and protruding into the stacked structure, the first region having a first width, the second region having a second width less than the first width, and the bowing region having a third width greater than the first width;
    forming a sacrificial layer contacting an inner surface of the first opening and filling the notch; and
    forming a plugging pattern completely filling the notch by oxidizing a portion of the sacrificial layer, the portion of the sacrificial layer formed along the inner surface of the first opening.

14. The method according to claim 13, wherein forming the stacked structure is configured to alternately forming first material layers and second material layers.

15. The method according to claim 14, wherein the notch is a space between an upper surface of one of the first material layers and a lower surface of one of the second material layers, the one of the first material layers and the one of the second material layers being in contact with each other.

16. The method according to claim 14, further comprising:
    forming second openings by removing the plugging pattern and the first material layers; and
    forming third material layers in the second openings.

17. The method according to claim 1, wherein the plugging pattern completely fills the notch.

* * * * *